United States Patent
Acosta et al.

(10) Patent No.: US 9,053,287 B1
(45) Date of Patent: Jun. 9, 2015

(54) NOTCH DETECTION AND CORRECTION IN MASK DESIGN DATA

(71) Applicant: Synopsys, Inc., Mountain View, CA (US)

(72) Inventors: Carlos Acosta, Santiago (CL); Daniel Salazar, Santiago (CL); Domingo Morales, Santiago (CL)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/225,379

(22) Filed: Mar. 25, 2014

Related U.S. Application Data (60) Provisional application No. 61/804,919, filed on Mar. 25, 2013.

(51) Int. Cl.
*G06F 17/50* (2006.01)

(52) U.S. Cl.
CPC ................................. *G06F 17/5081* (2013.01)

(58) Field of Classification Search
USPC ......................................... 716/50, 52, 54, 55
See application file for complete search history.

(56) References Cited

U.S. PATENT DOCUMENTS

| | | | | |
|---|---|---|---|---|
| 5,885,734 | A * | 3/1999 | Pierrat et al. | 716/53 |
| 5,943,487 | A * | 8/1999 | Messerman et al. | 716/112 |
| 6,470,489 | B1 * | 10/2002 | Chang et al. | 716/52 |
| 7,022,439 | B2 * | 4/2006 | Luttrell | 430/5 |

* cited by examiner

*Primary Examiner* — Sun Lin
(74) *Attorney, Agent, or Firm* — Kilpatrick Townsend & Stockton LLP (57) ABSTRACT

Mask data is analyzed for the presence of a notch. A notch candidate on a polygon boundary of mask data is defined as a plurality of line segments that includes an initial line segment, a final line segment and at least two line segments therebetween. The initial and final line segments define adjacent edges of the notch candidate and have an angle therebetween within a defined range. A direction of each line segment is a direction of travel from the initial line segment to the final line segment. A plurality of conditions is applied to the plurality of line segments and the direction of travel, and the notch candidate is a notch when all conditions are satisfied. The notch may be removed from the data before mask writing.

20 Claims, 8 Drawing Sheets

NOTCH DETECTION AND CORRECTION IN MASK DESIGN DATA

CROSS-REFERENCE TO RELATED APPLICATION

This application claims priority to U.S. provisional patent application No. 61/804,919, filed Mar. 25, 2013, which is incorporated herein in its entirety by reference.

TECHNICAL FIELD

This disclosure relates in general to the fabrication of semiconductor chips and more specifically to the analysis, including detection and correction, of notches in mask design data used in the layout of an integrated circuit (IC) for printing on a semiconductor chip.

BACKGROUND

A multi-step process is involved in the generation of a layout of an IC. An initial design typically undergoes revisions due to design for manufacturing (DFM) guidelines. That is, the initial design is revised to conform to the automated manufacturing process. These guidelines often impose the need for corrections inserted into areas within the design data flow. At times, this may require drastic modifications to the data, both during the layer derivation or design rule check (DRC) phase. This is especially true during the resolution enhancement technology (RET) phase, such as optical proximity correction (OPC).

One example of this problem may be described with reference to U.S. Pat. No. 6,792,592. More specifically, advances in IC technology have largely been accomplished by decreasing the feature size of circuit elements on the semiconductor chip. As the feature size continues to decrease, problems arise as a consequence of the optical lithography process used to manufacture the ICs that affect the circuit design. Namely, the process generally begins with the formation of a photoresist layer on the surface of a semiconductor wafer. A mask (which is also meant to include the term "reticle" herein) composed of opaque regions and light-transmissive clear regions is then positioned over the photo resist layer. Light is shone on the mask from a light source or some other type of electromagnetic radiation.

The light is reduced and focused through an optical system that contains a number of lenses, filters and mirrors to pass through the clear regions of the mask and expose the underlying photoresist layer while other portions of the photoresist layer underlying the opaque regions of the mask are unexposed. The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

BRIEF SUMMARY

Problems that arise during the optical lithography process may include "line end shortening" and "pullback." Essentially, the printed image that results from the design may exhibit variations that shorten lines, etc. Line end shortening, for example, is due to optical effects that cause the light to expose more of the resist under the end of a line than under other portions of the line. In order to compensate for line end shortening, designers often add additional features, such as "hammer heads" (essentially, T-shapes), onto line ends. These additional features may be added to a layout automatically during OPC. Pullbacks more generally represent a similar loss of definition of an edge surface.

Hammer heads and other polygon geometric changes may be introduced to the original design data during the data transformations of the original design for use by the lithography process. This can be a problem because data transformations may introduce notches into edge data (e.g., due to approximations). Pullbacks are especially prevalent when a pattern including notches is printed. Notches often needlessly contribute the complexity of the lithographic process, so their identification and subsequent repair before manufacture of a corresponding mask are desirable.

Disclosed embodiments describe ways to analyze mask design data for notches. In this way, they can be detected and, where desirable, corrected in the mask design data that is converted to commands for use in a mask-writing machine. Mask design data may also be called mask data herein to distinguish it from the original design data. One apparatus described herein includes a memory and a processor. The processor is configured to execute instructions stored in the memory to define a notch candidate on a boundary of a polygon of mask data, the notch candidate formed of a plurality of line segments, the plurality of line segments including an initial line segment, a final line segment and at least one line segment between the initial line segment and the final line segment, the initial line segment and the final line segment defining adjacent edges of the notch candidate and having an angle therebetween within a defined range, define a direction of each of the plurality of line segments as a direction of travel from the initial line segment to the final line segment, and apply a plurality of conditions to the plurality of line segments and the direction of travel, wherein the notch candidate is a notch when each of the plurality of conditions is satisfied.

Also described herein is a non-transitory computer-readable storage medium storing instructions that, when executed by a processor, perform the steps of defining a notch candidate on a boundary of a polygon of mask data, the notch candidate formed of a plurality of line segments, the plurality of line segments including an initial line segment, a final line segment and at least one line segment between the initial line segment and the final line segment, the initial line segment and the final line segment defining adjacent edges of the notch candidate and having an angle therebetween within a defined range, defining a direction of each of the plurality of line segments as a direction of travel from the initial line segment to the final line segment, and applying a plurality of conditions to the plurality of line segments and the direction of travel, wherein the notch candidate is a notch when each of the plurality of conditions is satisfied.

One method described herein includes defining a notch candidate on a boundary of a polygon of mask data, the notch candidate formed of a plurality of line segments, the plurality of line segments including an initial line segment, a final line segment and at least one line segment between the initial line segment and the final line segment, the initial line segment and the final line segment defining adjacent edges of the notch candidate and having an angle therebetween within a defined range, defining a direction of each of the plurality of line segments as a direction of travel from the initial line segment to the final line segment, and applying a plurality of conditions to the plurality of line segments and the direction of travel, wherein the notch candidate is a notch when each of the plurality of conditions is satisfied.

Another method described herein for analyzing mask data for notches includes defining a notch candidate on a boundary of a polygon of the mask data, the notch candidate formed of a plurality of line segments, the plurality of line segments including an initial line segment, a final line segment and at least one line segment between the initial line segment and the final line segment, the initial line segment and the final line segment having a defined angle therebetween and defining adjacent edges of the notch candidate, defining a direction of each of the plurality of line segments as a direction of travel from the initial line segment to the final line segment, defining a notch axis for the notch candidate as an axis orthogonal to each of the adjacent edges and pointed to one of an interior or an exterior of the polygon, and applying a plurality of conditions to the notch candidate using at least one of the direction of each of the plurality of line segments or the notch axis, wherein the notch candidate is a notch when the notch candidate satisfies each of the plurality of conditions.

Another apparatus for analyzing mask data for notches also includes a memory and a processor. In this example, the processor is configured to execute instructions stored in the memory to define a notch candidate on a boundary of a polygon of the mask data, the notch candidate formed of a plurality of line segments, the plurality of line segments including an initial line segment, a final line segment and at least one line segment between the initial line segment and the final line segment, the initial line segment and the final line segment having a defined angle therebetween and defining adjacent edges of the notch candidate, define a direction of each of the plurality of line segments as a direction of travel from the initial line segment to the final line segment, define a notch axis for the notch candidate as an axis orthogonal to each of the adjacent edges and pointed to one of an interior or an exterior of the polygon, and apply a plurality of notch conditions to the notch candidate using at least one of the direction of each of the plurality of line segments or the notch axis, wherein the notch candidate is a notch when the notch candidate satisfies each of the plurality of notch conditions.

Variations in these embodiments and other embodiments are described hereinafter.

BRIEF DESCRIPTION OF THE DRAWINGS

The description herein makes reference to the accompanying drawings wherein like reference numerals refer to like parts throughout the several views, and wherein.

DETAILED DESCRIPTION

As explained briefly above, mask data used by a mask writer is derived from original design data that can have geometrical shapes or geometry with edges at any angle. One common type of mask writer requires that mask geometries have edges at specific angles, because the writing process employs specific shapes. Therefore, before mask data can be passed to a mask writer, it must first be approximated or fractured. That is, a desired shape in the design data is approximated by smaller shapes compliant with capabilities of the mask writer. In one example, the smaller shapes may comprise only Manhattan-style output, i.e., shapes that have edges at only 0° or 90° (e.g., rectangles), or may comprise Manhattan-style output with the addition of 45° edges (e.g., rectangles and trapezoids) due to the capabilities of the mask writer. At various times during the mask data preparation using the original design data, notches may be introduced in the edges of the mask data due to the geometric transformations.

The inclusion of notches in the edges of the mask data is most often undesirable. Notches often do not contribute to the final manufacturing results, but instead contribute to the complexity of the surrounding geometry. For example, the introduced changes can substantially increase shot count, geometrical complexity and eventually conversion to mask writer machine formats. There may be cases in which the overall figure count (and hence shot count) can be reduced with minimum impact in the output quality if notches are detected and corrected. For example, valley notches may be filled in or peak notches cut off. Detecting notches in rectilinear data (Manhattan-style) and in axis-parallel directions may be achieved by employing dimensional measurement algorithms that measure edge distances along the outside of polygons. Such approaches do not work well with notches having different shapes, with all-angle lines and those exhibiting rotation.

According to the teachings herein, both valley and peak notches may be detected that are at all angles and rotations and may be detected independently of their shape. The notches found are candidates for removal in a subsequent processing step. In describing the teachings herein, terms are first defined relative to Manhattan-style data with reference to FIGS. 1A-6, and then those terms are used in a generalized algorithm capable of identifying various notches starting with FIG. 7.

Figure 1A:
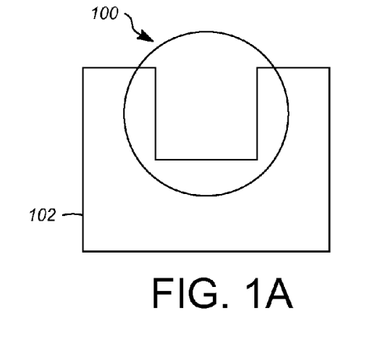
FIG. 1A is a diagram of a valley notch in mask data.
Figure 1B:
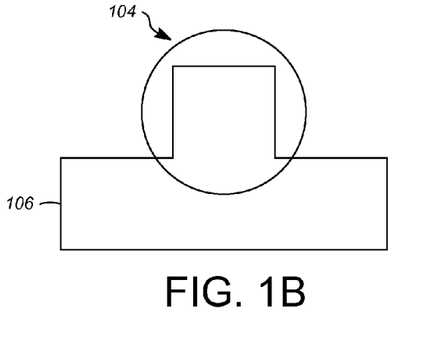
FIG. 1B is a diagram of a peak notch in mask data.

FIG. 1A is a diagram of a valley notch 100 in mask data 102, and FIG. 1B is a diagram of a peak notch 104 in mask data 106. As used herein, a notch is defined as the geometry involved in an imperfection in an otherwise smooth polygon contour. This imperfection may create a "valley" or a "peak"-type notch in the polygonal shape (or polygon) of the mask data. If such notches can be removed as described below, the polygon boundary would be smoother and the number of figures that result from fracturing the polygon (i.e., the final shot count) may be reduced.

Figure 2A:
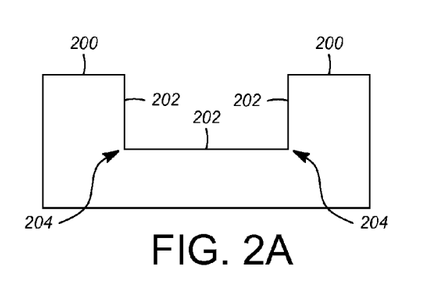
FIG. 2A is a diagram identifying nomenclature for edges involved in a valley notch.
Figure 2B:
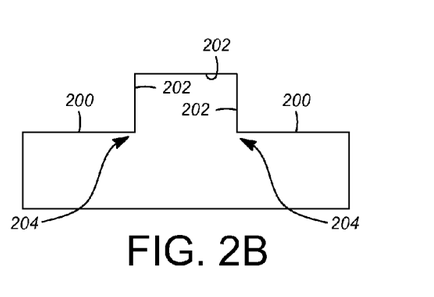
FIG. 2B is a diagram identifying nomenclature for edges involved in a peak notch.

FIG. 2A is a diagram identifying nomenclature for edges involved in a valley notch, while FIG. 2B is a diagram identifying nomenclature for edges involved in a peak notch. Edges surrounding each notch are called adjacent edges 200. As explained in more detail below, adjacent edges 200 must have the same direction when the polygon is represented as an oriented list of points. Note that in the Manhattan case illustrated in FIGS. 2A and 2B, adjacent edges 200 are parallel. In the general case, adjacent edges 200 are not necessarily parallel, as will be shown later. The edges between adjacent edges 200 are called internal edges 202, and the vertices forming those edges are internal vertices 204.

Figure 3A:
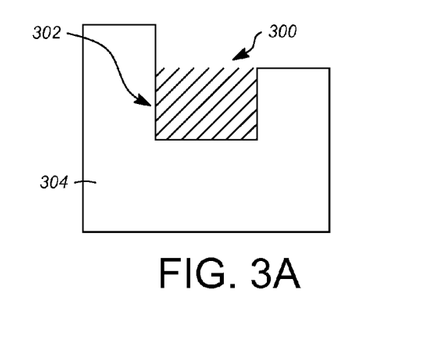
FIG. 3A is a diagram of an output notch associated with a valley notch in mask data.
Figure 3B:
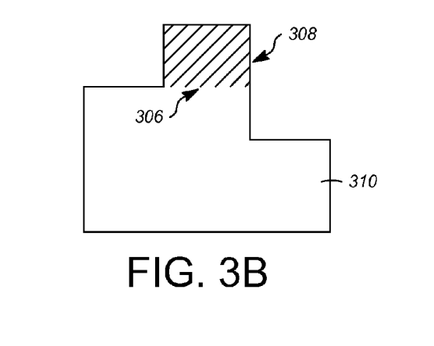
FIG. 3B is a diagram of an output notch associated with a peak notch in mask data.

As mentioned above, notches may be removed from a polygon of the mask data. An output notch as used herein is the geometrical shape or area required to either fill the gap created by a valley notch, or the geometrical shape that must be subtracted to remove a peak notch. FIG. 3A is a diagram of an output notch 300 associated with a valley notch 302 in mask data 304, and FIG. 3B is a diagram of an output notch 306 associated with a peak notch 308 in mask data 310. Note that, regardless of whether a subtraction or addition operation would be used, the operation is referred to as notch removal herein.

Figure 4A:
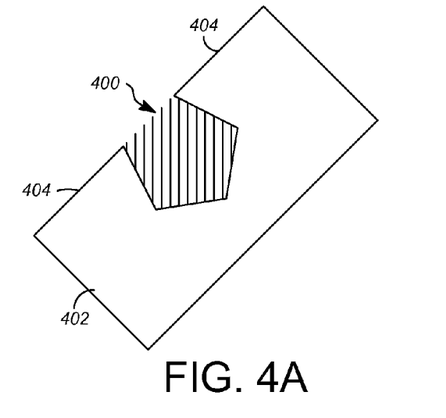
FIG. 4A is a diagram of an alternative valley notch in mask data.
Figure 4B:
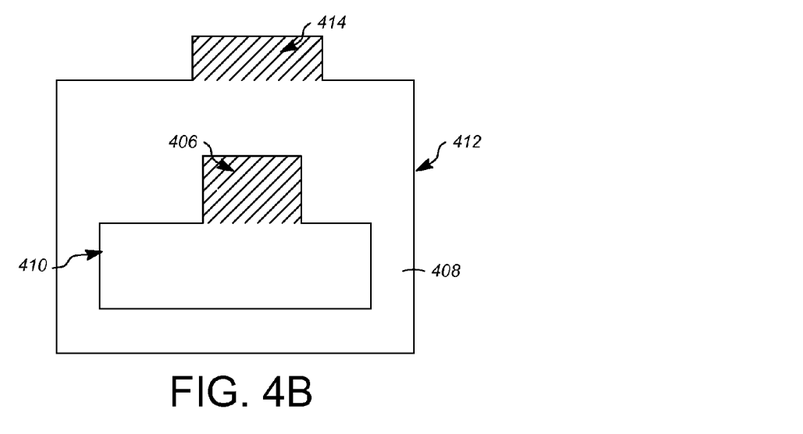
FIG. 4B is a diagram of an alternative valley notch in mask data.

In the general case, notches are not necessarily formed by perfectly orthogonal edges, nor are the adjacent edges necessarily parallel to the X- or Y-axis or to each other. For example, FIG. 4A is a diagram of an alternative valley notch 400 in mask data 402. In this case, valley notch 400 does not have orthogonal edges, and its adjacent edges 404 are rotated as compared to those in FIGS. 1A, 2A and 3A. Additionally, notches are not necessarily part of the outside boundary and can also be found in internal boundaries of polygons forming the mask data. FIG. 4B is a diagram of an alternative valley notch 406 in mask data 408. More specifically, mask data 408 of FIG. 4B has both an internal boundary 410 and an outer boundary 412. A peak notch 414 is formed in outer boundary 412 in a similar manner as in FIGS. 1B, 2B and 3B. Valley notch 406 is formed in internal boundary 410 in FIG. 4B.

Figure 5:
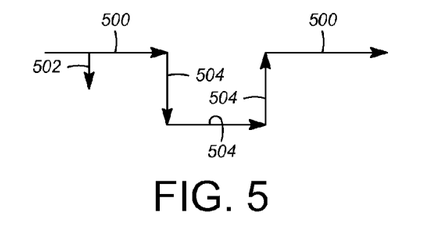
FIG. 5 is a diagram of a set of edges forming a notch and illustrating a notch axis of the notch.
Figure 6:
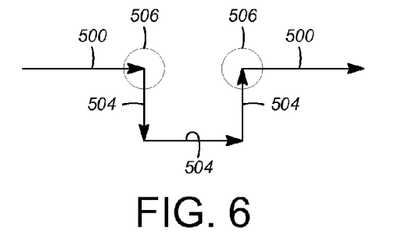
FIG. 6 is a diagram of the set of edges of FIG. 5 illustrating notch endpoints of the notch.

Referring again to strictly Manhattan-style output for reference, FIG. 5 is a diagram of a set of edges forming a notch and illustrating a notch axis of the notch. FIG. 6 is a diagram of the set of edges of FIG. 5 illustrating notch endpoints of the notch. Adjacent edges 500 define respective orthogonal axes pointing to the interior and to the exterior of the polygon boundary, depending on the notch in question. The axis that points to the interior is called the valley axis, and the axis that points to the exterior is the peak axis. Both are known as a notch axis 502. The vertices that are shared between adjacent edges 500 and internal edges 504 are called notch endpoints 506. Two segments forming a polygon shape (such as adjacent edge 500 and internal edge 504 or internal edge 504 and internal edge 504) are said to point in the same direction herein if their dot product is positive (that is, the angle between the segment vectors is not greater than 90 degrees and less than 270 degrees). In this implementation, the magnitude of the notch axis is not particularly relevant, but its direction is used for certain of the notch conditions described in additional detail below. Note that it does not matter in which order the line segments between points are considered in the analysis as long as the order is consistent from one adjacent edge to the other.

Next described is the use of these variables for notch detection that finds both valley and/or peak notches that are candidates for removal. The algorithm described is generalized and invariant to data rotation, so that it can find notches in data rotated in any angle. It includes parameters to control the dimensions of detected notches, as well as algorithm tolerances and data reach. By using the teachings herein, reducing the complexity of mask design by eliminating irrelevant data may be achieved. More specifically, the removal of certain notches may reduce complexity and hence reduce shot count in mask production and/or during mask data preparation.

Figure 7:
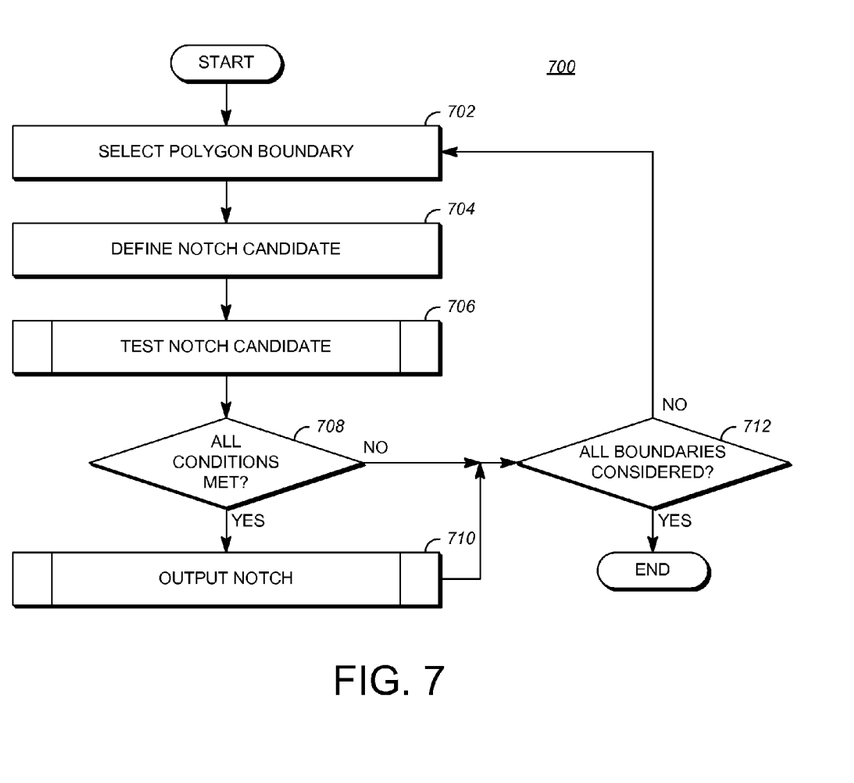
FIG. 7 is a flowchart diagram of a notch detection algorithm according to the teachings herein.

FIG. 7 is a flowchart diagram of a notch detection algorithm 700 according to the teachings herein. For simplicity of explanation, algorithm 700 is depicted and described as a series of steps. However, steps in accordance with this disclosure can occur in various orders and/or concurrently. Additionally, steps in accordance with this disclosure may occur with other steps not presented and described herein. Furthermore, not all illustrated steps may be required to implement a method in accordance with the disclosed subject matter. Algorithm 700 is described with respect to one polygon within the mask data. However, algorithm 700 may be performed for any number of polygons within the mask data.

A step 702 of algorithm 700 selects a boundary of a polygon within the mask data. For the selected polygon boundary, a notch candidate is defined in step 704. That is, a subset of contiguous points is selected where the initial and final segments form substantially parallel edges according to a specified tolerance. Because the angular tolerance specified for these edges has a significant impact on the consistency of the results, it should be a small value to keep the decisions simple. Edges so identified or selected define adjacent edges of the notch candidate, such as adjacent edges 200 in FIGS. 2A and 2B for example.

If the angle tolerance between the two adjacent edges is 0 degrees, then the adjacent edges must be parallel. If there is a tolerance defined, edges will not be adjacent edges unless ABS(angleL−angleR)<tolerance. For example, if the angle of left adjacent edge is 30°, the angle of right adjacent edge is 30.5°, and the tolerance is specified as 1°, adjacent edges of a notch candidate are identified. The selection of the tolerance would vary depending on the mask data characteristics, for example. It may also vary depending upon the goals of the algorithm. For example, the algorithm described herein could be used more generally to detect other features in addition to notches, such as corner jogs (i.e., features similar to a notch, but on a corner instead of an otherwise smooth polygon boundary). The adjacent edges could then be defined by edges that are within a value plus a tolerance of each other. For example, a value of 0° with a tolerance of +/−1° would define a notch, a value of 90° with a tolerance of +/−1° would define an inside orthogonal corner jog, and a value of −90° with a tolerance of +/−1° would define an outside orthogonal corner jog, etc.

At step 706, a process occurs that tests the notch candidate to determine if it is a notch. More specifically, using the subset of points of the notch candidate joined by line segments reflecting a continuous travel direction about a boundary, a number of conditions are tested as described in more detail hereinafter. These are called notch conditions herein, and they include a set of geometric properties that must be met by a portion of a boundary to qualify as a notch. The conditions can be validated without caring about a particular orientation.

If all of the conditions are met or fulfilled as indicated by the result of the query of step 708, the output notch associated with the notch is found and its geometrical shape or geometry reported in step 710 as discussed in additional detail below. Algorithm 700 then advances to query whether all boundaries of the polygon or all boundaries in the mask data to be analyzed have been considered in step 712. If all boundaries have been considered, processing ends. Otherwise, algorithm 700 returns to step 702 to select a new boundary of the polygon or the next polygon for processing.

Referring again to step 708, if all conditions are not satisfied for the current notch candidate, processing advances directly to step 712 since the current notch candidate is not a notch.

Algorithm 700 as shown illustrates a situation where only one test notch is in a boundary. However, this is not necessarily the case, so algorithm 700 may repeat steps 706, 708 and 710 a number of times for a boundary where more than one notch candidate is defined or identified at step 704.

Although not shown in FIG. 7, the output notch may be filtered based on custom criteria in a variation of algorithm 700. This filtering is discussed in additional detail below and may be used to ignore all but notches of a certain configuration, size, orientation, etc.

The testing of the notch candidate in step 706 may include four notch conditions described with respect to FIGS. 8-11. FIGS. 8A-8D are diagrams explaining a first notch condition of the notch detection algorithm of FIG. 7, FIGS. 9A and 9B are diagrams explaining a second notch condition of the notch detection algorithm of FIG. 7, FIGS. 10A and 10B are diagrams explaining a third notch condition of the notch detection algorithm of FIG. 7, and FIGS. 11A-11C are diagrams explaining a fourth notch condition of the notch detection algorithm of FIG. 7.

Figure 8A:
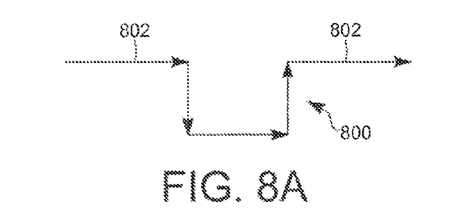
FIGS. 8A-8D are diagrams explaining a first notch condition of the notch detection algorithm of FIG. 7.
Figure 8B:
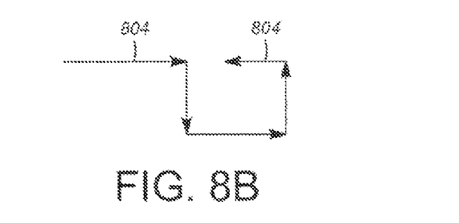
Figure 8C:
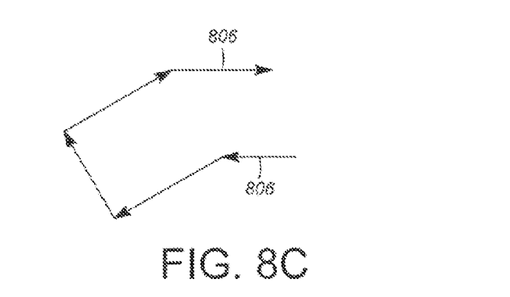
Figure 8D:
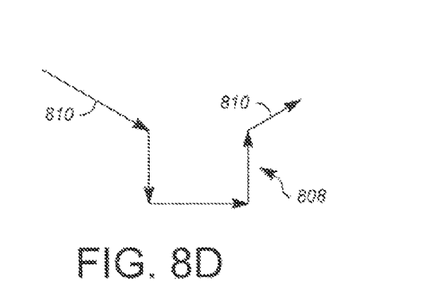

Referring initially to FIGS. 8A-8D, the first notch condition is that adjacent edges be parallel within a defined tolerance and that they follow the same direction. FIG. 8A is the canonical example in Manhattan geometry. The notch candidate 800 with this boundary would satisfy the first notch condition since its adjacent edges 802 are in parallel and follow the same direction. In contrast, FIGS. 8B and 8C illustrate sets of edges that do not fulfill the first notch condition because the adjacent edges 804, 806 in each go in opposite directions although they are substantially parallel. A notch candidate 808 with a boundary shaped according to FIG. 8D may be accepted or rejected as a valid candidate (i.e., may satisfy or not satisfy the first notch condition) depending on the parallel tolerance specified for adjacent edges 810. Note that adjacent edges 810 are not in parallel, but they do point in the same general direction. If they are within the parallel tolerance, they would be considered substantially parallel such that notch candidate 808 satisfies the first notch condition.

Figure 9A:
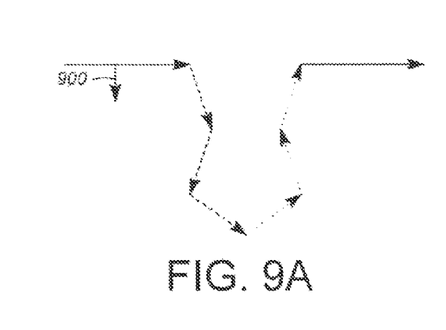
FIGS. 9A and 9B are diagrams explaining a second notch condition of the notch detection algorithm of FIG. 7.
Figure 9B:
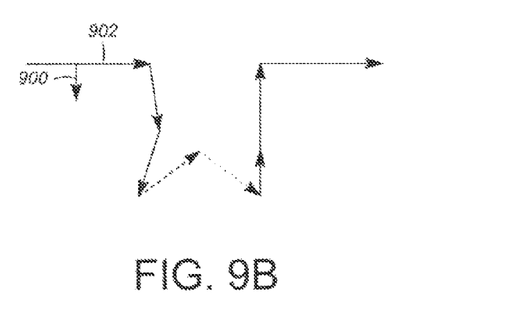

The second notch condition involves splitting the internal edges into two sets—known as the upwards and downwards sets according to the notch axis—that satisfy two restrictions. The first restriction is that the edges in the first set point in the same direction relative to the notch axis and those edges in the second set point in the opposite direction. The second restriction is that the two sets of edges each define a contiguous sequence of edges. As a consequence of these restrictions, if an edge is found that does not point in the same direction while traversing the edges of the first set and starting from one of the adjacent edges, then that edge signals the beginning of the second set, which moves in the opposite direction to the first to arrive at the other adjacent edge. When the adjacent edges are not exactly parallel, the notch axis is defined as the average of the axes defined by each adjacent edge.

In FIGS. 9A and 9B, arrow 900 represents the notch axis in each diagram. Referring first to FIG. 9A, the first set of internal edges corresponds to the set that has the same general direction of the notch axis 900 and is shown in dashed segments, and the second set of edges has the opposite direction of the notch axis 900 and is shown in dotted segments. Both sets of segments, the dashed and the dotted, satisfy the restrictions. Hence, FIG. 9A may represent a valid notch as it satisfies the second notch condition. In contrast, FIG. 9B shows a boundary shape that does not comply with the second notch condition. To comply with the second notch condition, the dashed segment would need to signal the beginning of a set of segments that always point in the same direction (in contrast to the direction of the solid segments starting at the first adjacent edge 902). Instead, the next (dotted) segment is going in the opposite direction of the dashed segment.

Figures 10A, 10B:
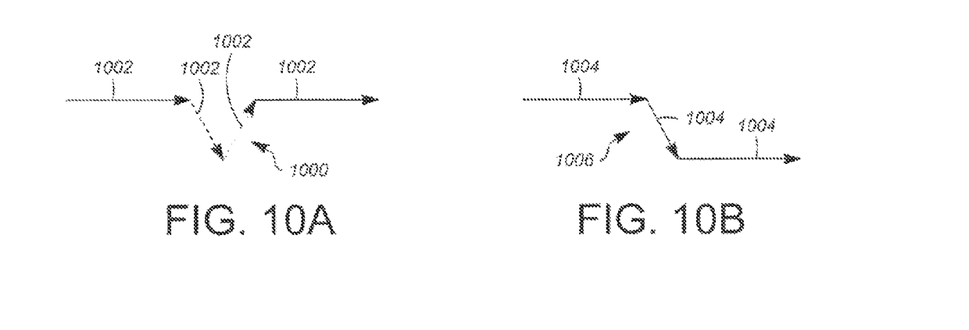
FIGS. 10A and 10B are diagrams explaining a third notch condition of the notch detection algorithm of FIG. 7.

The third notch condition is related to the second notch condition. That is, there needs to be at least one edge in each of the sets of edges described in the second notch condition. This means that the minimum number of edges for a notch is four, two adjacent edges and two edges, one edge in each of the two sets of edges. FIG. 10A is an example of a notch candidate 1000 showing the minimum number of edges 1002 required to form a notch, thus satisfying the third notch condition. FIG. 10B shows only three edges 1004, thus notch candidate 1006 fails to satisfy the third notch condition.

Figure 11A:
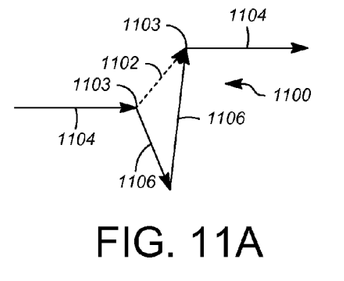
FIGS. 11A-11C are diagrams explaining a fourth notch condition of the notch detection algorithm of FIG. 7.
Figure 11B:
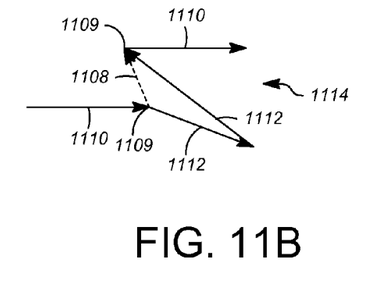
Figure 11C:
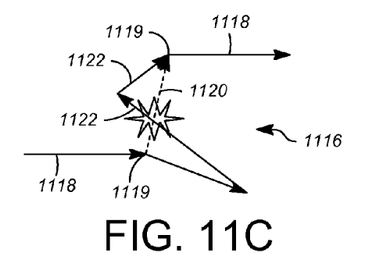

The fourth and final notch condition is that an imaginary edge joining notch endpoints (see FIG. 6) points in the same direction as the adjacent edges, and it does not intersect any internal edge of the candidate notch. This is illustrated in FIGS. 11A-11C. FIG. 11A illustrates a notch candidate 1100 where the fourth notch condition is met because imaginary edge 1102 joining notch endpoints 1103 points in the same direction as adjacent edges 1104 and because imaginary edge 1102 does not intersect any internal edge 1106 of notch candidate 1100. In contrast, and while imaginary edge 1108 between notch endpoints 1109 does not intersect any internal edge 1112, notch candidate 1114 of FIG. 11B does not meet the fourth notch condition because imaginary edge 1108 points to the left but adjacent edges 1110 point to the right. In another example, notch candidate 1116 of FIG. 11C does not meet the fourth notch condition because adjacent edges 1118 and imaginary edge 1120 joining notch endpoints 1119 point in the same general direction (i.e., rightward), but imaginary edge 1120 intersects one of the internal edges 1122.

In brief, at least one notch candidate is detected in a polygon boundary by tracing a sequence of edges between two adjacent edges of a closed polygon boundary of a segment of mask data. The adjacent edges are substantially parallel to each other. Since the edges have a direction of travel (reflected by the sequence) between points defining the beginnings and endings of each edge, they may also be called vectors or vector segments. Various conditions are applied to the edges and their direction of travel starting with one adjacent edge and ending with the other adjacent edge to determine whether a notch candidate is a notch.

In this example, a sequence of edges that fulfills all four conditions is considered to be a notch in the polygon boundary, or a detected notch. As described with respect to FIG. 7, this sequence is next passed on to an output notch computation sequence represented by step 710. The output notch is a polygon boundary formed by some of the internal vertices, plus an eventual extra vertex. This polygon boundary as reported could be used to fill valley notches by adding the new geometry, or to remove peak notches by subtracting the new geometry.

Figure 12A:
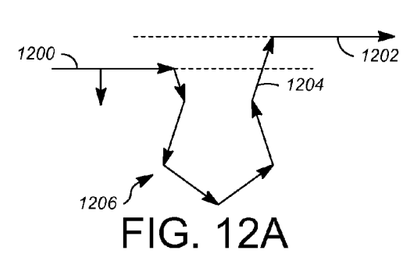
FIGS. 12A-12C are diagrams illustrating an output notch computation sequence for one notch example.
Figure 12B:
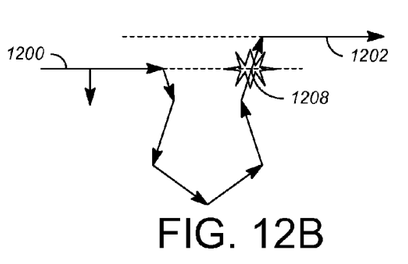
Figure 12C:
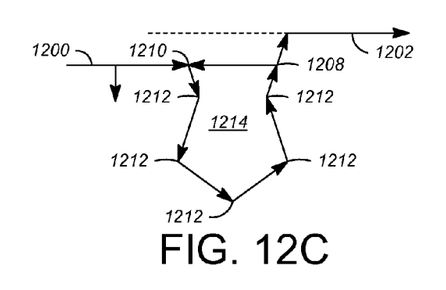

The output notch computation sequence uses the information related to the notch candidate that satisfies all of the notch conditions as input, that is, a notch. In order to compute the output notch, the edge vertices that make up the boundary are needed. Therefore, the output notch computation sequence finds a set of vertices that defines the output notch required to correct the detected notch. FIGS. 12A-12C are three diagrams illustrating an output notch computation sequence for one notch example.

The first step in the sequence is to extend both adjacent edges of the notch. Depending on the notch geometry, it is possible that none, one or both of the adjacent edges collide with an internal edge. FIG. 12A shows an example of a common set of edges that fulfill the notch conditions where extending adjacent edges 1200, 1202 results in only on adjacent edge, here left adjacent edge 1200, intersects with an internal edge 1204 of notch 1206. If the extension of only one adjacent edge collides with an internal edge such as shown by example in FIG. 12A, then the intersection point 1208 is calculated as shown in FIG. 12B and is identified as a new vertex. The reported boundary will consist of the notch endpoint 1210 from the extended adjacent edge 1200 and all the internal vertices 1212 up to the intersection point 1208 as shown in FIG. 12C. That is, the output notch 1212 is formed by all the vertices 1210, 1212 between the intersecting adjacent edge 1200 and the new vertex 1208.

Figure 14:
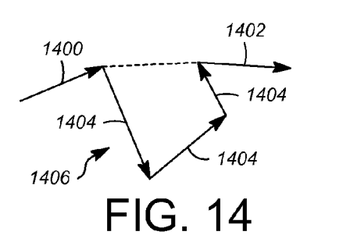
FIG. 14 is a diagram illustrating yet another notch example subjected to the output notch computation sequence.
Figure 15:
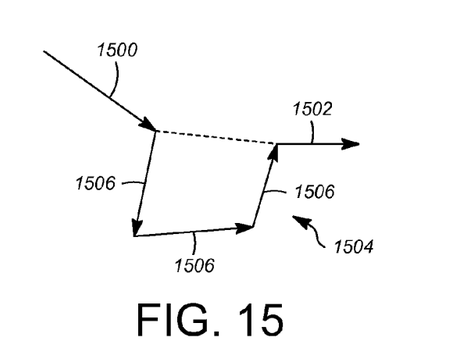
FIG. 15 is a diagram illustrating yet another notch example subjected to the output notch computation sequence.

The example above shows a simple example with an easily identifiable notch 1206. In contrast to the above example, the reported boundary will consist of all the internal vertices if two or none of the extended adjacent edges intersect with an internal edge. Examples of such notches are shown in FIGS. 13-15.

Figure 13:
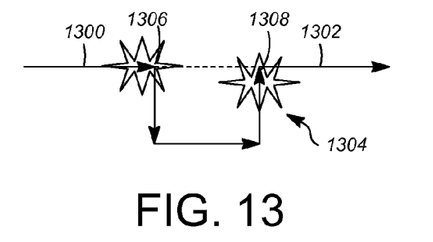
FIG. 13 is a diagram illustrating another notch example subjected to the output notch computation sequence.

More specifically, FIG. 13 is a diagram illustrating another notch example subjected to the output notch computation sequence. In this example, adjacent edges 1300, 1302 of notch 1304 are not only parallel, but also collinear, so extending either edge 1300, 1302 will collide exactly at the vertex 1306 or 1308 where the other adjacent edge starts or finishes. Thus, both projections can be said to intersect internal edges. FIG. 14 is a diagram illustrating yet another notch example subjected to the output notch computation sequence. In this example, none of the extended adjacent edges 1400, 1402 intersect an internal edge 1404 of notch 1406. FIG. 15 is a diagram illustrating yet another notch example subjected to the output notch computation sequence. This, like FIG. 13, is a case in which both extended adjacent edges 1500, 1502 of a notch 1504 intersect internal edges 1506.

As can be seen from these examples, the notch conditions and the output notch computation are independent of the notch being of peak or valley type because of the way that the notch axis is defined. The notch type is only relevant for filtering purposes discussed below. Each of these examples is a case where the adjacent edges are parallel or close to parallel. However, a clear notch can still be defined with non-parallel adjacent edges where the edges are parallel or close to parallel.

Figure 16:
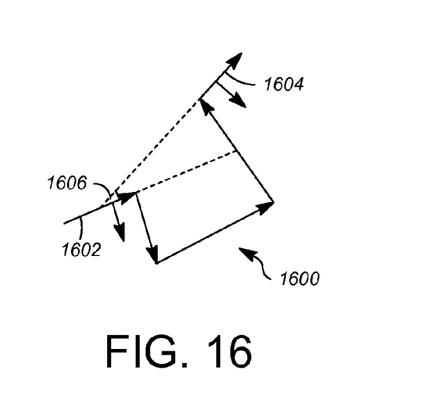
FIG. 16 is a diagram illustrating a notch example subjected to the output notch computation sequence where non-parallel adjacent edges define a clear notch.

FIG. 16 is a diagram illustrating a notch example subjected to the output notch computation sequence where non-parallel adjacent edges define a clear notch 1600. When adjacent edges 1602, 1604 are not parallel because the angular difference 1606 is within the defined angle tolerance, the teachings herein may still be used without changes in some cases. For large enough angle differences between adjacent edges, however, it is possible to accept a geometrical shape that is not a notch.

Next, certain practical considerations are described, starting with output notch filtering. There are different criteria by which the output notches reported by the algorithm could be filtered out. In the following, two practical examples are shown.

Figure 17:
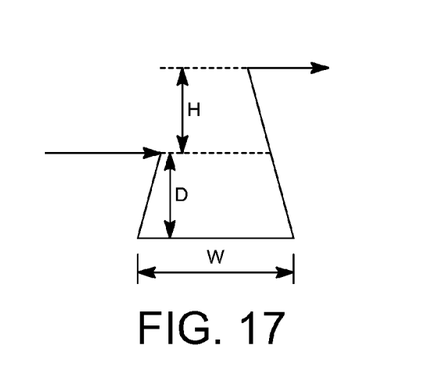
FIG. 17 is a diagram of notch dimensional parameters that can be used in a notch filtering process.

First, the output notch can be filtered out depending on specific user restrictions (e.g., local interactions). For instance, the user could be interested only in a specific type of notch (valley or peak) satisfying some strict dimensional requirements. FIG. 17 shows an example of such a situation. That is, FIG. 17 is a diagram of notch dimensional parameters that can be used in a notch filtering process. The depth D, height H and width W parameters allow a sensible amount of control to recognize valid notches that would not modify the geometrical shapes of the mask data in undesired ways, while still detecting a reasonable number of notch cases.

Figure 18A:
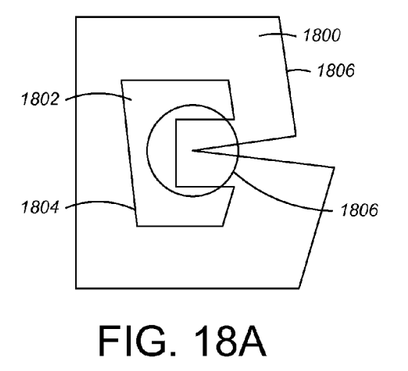
FIGS. 18A and 18B are diagrams of polygons affected by non-local interactions.
Figure 18B:
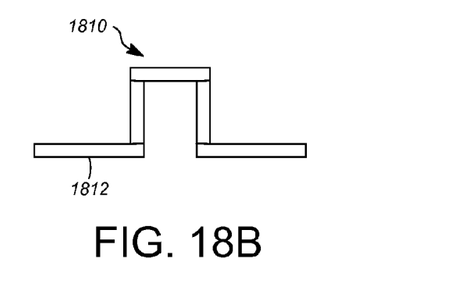

Second, it is worth noting that the algorithm described herein is local in nature. The obtained output notch could interact with other non-local parts of the polygon causing undesired results when the output notch is used to repair the notch geometry, depending on how the repair operation is performed. For instance, the polygon obtained as a result of the repair operation could have self-intersections or lose connectivity. Such non-local interactions are desirably recognized. FIGS. 18A and 18B are diagrams of polygons affected by non-local interactions.

In the example of FIG. 18A, mask data in the form of a polygon 1800 with a hole 1802 is shown. Thus, the mask data has interior and exterior or outside boundaries. If only interior boundary 1804 is investigated, the highlighted notch 1806 is quickly detected. Nevertheless, if exterior boundary 1808 is not considered while removing notch 1806, undesired effects may occur, as the removal of this interior notch 1806 will cause interior boundary 1804 to intersect exterior boundary 1808. In the example of FIG. 18B, the edge sequence along the upper part of the polygon 1812 contour forms a peak notch 1810, which is clear and easy to detect. However, removing peak notch 1810 will cause polygon 1812 to break into two polygons with no connectivity.

Figure 19A:
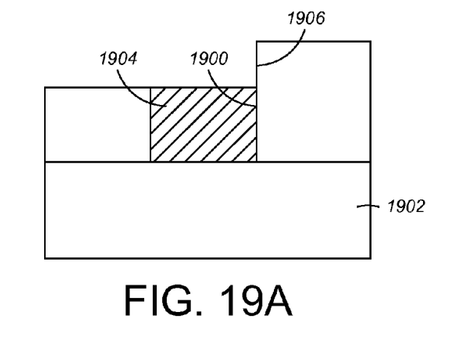
FIG. 19A is a diagram of a Manhattan edge notch example with no coordinate snapping.
Figure 19B:
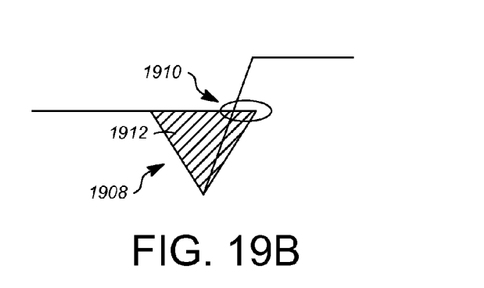
FIG. 19B is a diagram of an all-angle edge notch example with coordinate snapping.

Another practical consideration is coordinate snapping. In some steps of the proposed algorithm, edge intersections are calculated. These intersections are precise only if the edges involved are orthogonal or 45° diagonals such as shown in FIG. 19A, which is a diagram of a Manhattan edge notch example with no coordinate snapping. Notch 1900 is formed by a combination of mask data 1902 such that the output notch computation sequence results in output notch 1904 using intersecting point 1906. If the edges involved are not orthogonal or 45° diagonals, such as shown in FIG. 19B, which is a diagram of an all-angle edge notch 1908 example with coordinate snapping, rounding due to coordinate snapping may cause small differences 1910 between the output notch 1912 and the area actually required to remove notch 1908, because vertex coordinates are usually on a specific resolution grid.

Certain performance considerations are also relevant to the discussion herein. In order to avoid an algorithm of undesired complexity when traversing the polygon boundaries looking for possible notches, the algorithm may look for notches formed by a fixed maximum number of edges. It is possible that notches formed by a big number of edges will not be detected. If they are formed by so many edges, however, it is likely they are not really notches, or at least not relevant notches, and therefore should not be detected.

As presented, the algorithm will detect notches starting from a given edge up to another given edge. It is possible that a set of edges is part of a bigger notch than the one detected. For reasons of complexity, looking for such notches is not recommended even though it is possible. Such cases can still be detected by successively applying the algorithm and repair operation if desired.

By using only relative directions of the edges, the notch detection described herein allows a strongly rotation-resistant recipe to locate notches.

The algorithm described herein was successfully tested on real designs. By carefully choosing filtering strategies, several notches could be found and repaired, and the final shot count of the design was reduced. Designating a parallel tolerance for the adjacent edges is desirable for real world cases. During testing, many cases were encountered in which a clear notch was rotated in such a way that the adjacent edges originally parallel result with a slight snapping that caused them to be non-parallel after the rotation is applied. Without the parallel tolerance, such cases would go unnoticed.

Although the filtering restrictions are described as optional, they are very valuable in practice. Real world designs contain several sequences of edges that fulfill the notch conditions but are not relevant for particular applications.

Figure 20:
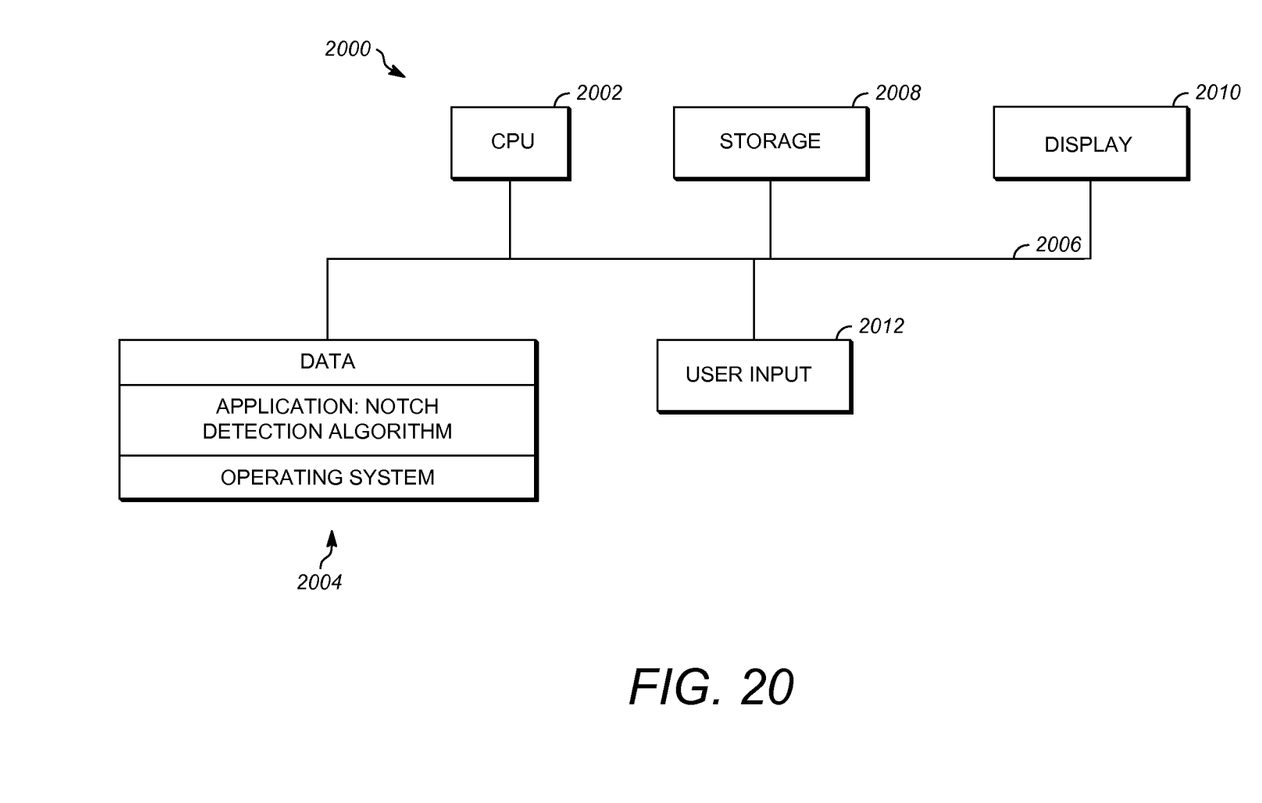
FIG. 20 is a diagram of a computing device in which the teachings herein may be incorporated.

FIG. 20 is a diagram of a computing device 2000 in which the teachings herein may be incorporated. Computing device 2000 can be in the form of a computing system including multiple computing devices, or in the form of a single computing device, for example, a mobile phone, a tablet computer, a laptop computer, a notebook computer, a desktop computer, and the like.

A CPU 2002 in computing device 2000 can be a conventional central processing unit. Alternatively, CPU 2002 can be any other type of device, or multiple devices, capable of manipulating or processing information now-existing or hereafter developed. Although the teachings herein can be practiced with a single processor as shown, e.g., CPU 2002, this is not required. More than one processor may be used. Unless otherwise noted herein, references to a processor may refer to one or more processors functioning together to perform the described processes or steps.

A memory 2004 in computing device 2000 may be a random access memory (RAM) device, but can be any other suitable type of storage device. Memory 2004 can include code and data that is accessed by CPU 2002 using a bus 2006. Memory 2004 can further include an operating system and one or more application programs. In this example, the application programs include at least one program that permits CPU 2002 to perform the notch detection algorithm described here. Computing device 2000 can also include a secondary storage 2008, which can, for example, be a disk drive.

Computing device 2000 can also include one or more peripheral devices, such as a display 2010. Display 2010 may be, in one example, a touch sensitive display that combines a display with a touch sensitive element that is operable to sense touch inputs. Display 2010 is coupled to CPU 2002 via bus 2006. When included, display 2010 can be implemented in various ways, including by a liquid crystal display (LCD), a cathode-ray tube (CRT) display or light emitting diode (LED) display, such as an OLED display. The touch sensitive element can be coupled to CPU 2002 via user input interface 2012 and bus 2006, for example. User input interface 2012 can also be used to couple a keyboard, a mouse or any other means of acquiring input from a user for processing using CPU 2002.

Although FIG. 1 depicts CPU 2002 and memory 2004 of computing device 2000 as being integrated into a single unit, other configurations can be utilized. The operations of CPU 2002 can be distributed across multiple machines (each machine having one or more of processors) that can be coupled directly or across a local area or other network. Memory 2004 can be distributed across multiple machines such as a network-based memory or memory in multiple machines performing the operations of computing device 2000. Although depicted here as a single bus, bus 2006 of computing device 2000 can be composed of multiple buses. Further, secondary storage 2008 can be directly coupled to the other components of computing device 2000 or can be accessed via a network and can comprise a single integrated unit such as a memory card or multiple units such as multiple memory cards. Computing device 2000 can thus be implemented in a wide variety of configurations. Data received and used by computing device 2000 may be received by CPU 2002 internally from memory 2004 or storage 2008 or may be received externally from other, related processes through bus 2006.

Implementations of computing device 2000 (and the algorithms, methods, instructions, etc., stored thereon and/or executed thereby as described herein) may be realized in hardware, software, or any combination thereof. The hardware can include, for example, computers, IP cores, ASICs, PLAs, optical processors, PLCs, microcode, microcontrollers, servers, microprocessors, digital signal processors or any other suitable circuit. In the claims, the term "processor" should be understood as encompassing any of the foregoing hardware or other like components to be developed, either singly or in combination.

In one example, computing device 2000 may be implemented using a general purpose computer or general purpose processor with a computer program that, when executed, carries out any of the respective methods, algorithms and/or instructions described herein. In addition or alternatively, for example, a special purpose computer/processor can be utilized which can contain other hardware for carrying out any of the methods, algorithms, or instructions described herein. Further, some or all of the teachings herein may take the form of a computer program product accessible from, for example, a tangible (i.e., non-transitory) computer-usable or computer-readable medium. A computer-usable or computer-readable medium is any device that can, for example, tangibly contain, store, communicate, or transport the program for use by or in connection with any processor. The medium may be an electronic, magnetic, optical, electromagnetic or semiconductor device, for example.

Although notch detection has been described herein generally as occurring to the design data input to the fracturing process to generate the data in mask writer machine format, the teachings herein may be used at any time during the process of generating the design data input, including at intermediate designs, and can be used for any of a number of mask layers associated with a single layout. Further, the teachings can be used on the design data in mask writer machine format, if desired, to modify the final data used for writing. Note that the mask data shown in the figures are geometrical representations of mask data stored in a tangible, non-transitory medium (e.g., computer memory) for manipulation according to the teachings herein and may or may not also be included in other tangible formats, such as on paper.

The teachings herein as described are related to identifying one or more features within or on a boundary of a polygon having certain characteristics. By example, these teachings are applied to the polygon shapes of mask data. However, the teachings herein may be used to identify such features in other data sets including polygonal data. Three-dimensional (3-D) printing, for example, may benefit from identifying and removing notch features as described herein from input data before printing.

While this disclosure includes certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus, comprising:
    a memory; and
    a processor configured to execute instructions stored in the memory to:
        define a notch candidate on a boundary of a polygon of mask data when the processor is invoked to receive the mask data, the notch candidate formed of a plurality of line segments, the plurality of line segments including an initial line segment, a final line segment and at least two line segments between the initial line segment and the final line segment, the initial line segment and the final line segment defining adjacent edges of the notch candidate and having an angle therebetween within a defined range;
        define a direction of each of the plurality of line segments as a direction of travel from the initial line segment to the final line segment; and
        apply a plurality of conditions to the plurality of line segments and the direction of travel, wherein the notch candidate is a notch when each of the plurality of conditions is satisfied.

2. The apparatus of claim 1 wherein the processor is configured to apply the plurality of conditions by:
    applying a first condition that is satisfied when the direction of each of the adjacent edges is a same direction and the adjacent edges are parallel within a defined tolerance.

3. The apparatus of claim 2 wherein the at least two line segments are at least two internal edges and wherein the processor is configured to apply the plurality of conditions by applying a second condition by:
    defining a notch axis for the notch candidate as an axis orthogonal to each of the adjacent edges and pointed to one of an interior or an exterior of the polygon;
    adding the at least two internal edges to a first set of edges when the at least two internal edges have a same direction relative to the interior of the polygon as the notch axis or to a second set of edges when the at least two internal edges have an opposite direction relative to the interior of the polygon from the notch axis; and
    traversing the plurality of line segments along the direction of travel from the initial line segment to the final line segment; wherein the second condition is satisfied when any internal edges in the first set of edges are contiguous and any internal edges in the second set of edges are contiguous.

4. The apparatus of claim 3 wherein the processor is configured to apply the plurality of conditions by:
    applying a third condition that is satisfied when the at least two line segments comprise at least one line segment in the first set of edges and at least one line segment in the second set of edges.

5. The apparatus of claim 4 wherein the processor is configured to apply the plurality of conditions by applying a fourth condition by:
    defining an imaginary edge between an end point of the initial line segment as defined by the direction of travel and a starting point of the final line segment as defined by the direction of travel; and wherein the fourth condition is satisfied when a direction of the imaginary edge from the initial line segment and the final line segment is a same direction relative to the adjacent edges and does not intersect any line segment of the at least two line segments.

6. The apparatus of claim 2 wherein the processor is configured to define a notch axis for the notch candidate as an axis orthogonal to each of the adjacent edges and pointed to one of an interior or an exterior of the polygon; and to apply the plurality of conditions by:
    applying a second condition that is satisfied when the at least two line segments comprise at least one line segment having a same direction relative to the interior of the polygon as the notch axis and at least one line segment having a opposite direction relative to the interior of the polygon from the notch axis.

7. The apparatus of claim 6 wherein the processor is configured to apply the plurality of conditions by applying a third condition by:
    defining an imaginary edge between an end point of the initial line segment as defined by the direction of travel and a starting point of the final line segment as defined by the direction of travel; and wherein the first condition is satisfied when a direction of the imaginary edge from the initial line segment and the final line segment is a same direction relative to the adjacent edges and does not intersect any line segment of the at least two line segments.

8. The apparatus of claim 1 wherein the processor is configured define a notch axis for the notch candidate as an axis orthogonal to each of the adjacent edges and pointed to one of an interior or an exterior of the polygon; and to apply the plurality of conditions by:
    applying a first condition that is satisfied when the at least two line segments comprise at least one line segment having a same direction relative to the interior of the polygon as the notch axis and at least one line segment having an opposite direction relative to the interior of the polygon from the notch axis.

9. The apparatus of claim 1 wherein the notch is one of a valley notch or a peak notch and the processor is configured to:
    generate an output notch for the notch, wherein the output notch is a geometrical shape sized to fill a gap in the polygon created by the valley notch such that addition of the output notch removes the valley notch or is a geometrical shape having a size conforming to the peak notch such that subtraction of the output notch removes the peak notch.

10. A non-transitory computer-readable storage medium storing instructions that, when executed by a processor, cause the processor to perform step of:
    defining a notch candidate on a boundary of a polygon of mask data, the notch candidate formed of a plurality of line segments, the plurality of line segments including an initial line segment, a final line segment and at least two line segments between the initial line segment and the final line segment, the initial line segment and the final line segment defining adjacent edges of the notch candidate and having an angle therebetween within a defined range;

defining a direction of each of the plurality of line segments as a direction of travel from the initial line segment to the final line segment; and applying a plurality of conditions to the plurality of line segments and the direction of travel, wherein the notch candidate is a notch when each of the plurality of conditions is satisfied.

11. The non-transitory computer-readable storage medium of claim 10 wherein the notch is one of a valley notch or a peak notch, the instructions comprising an instruction that, when executed by the processor, causes the processor to perform a step of:

generating an output notch for the notch, wherein the output notch is a geometrical shape sized to fill a gap in the polygon created by the valley notch such that addition of the output notch removes the valley notch or is a geometrical shape having a size conforming to the peak notch such that subtraction of the output notch removes the peak notch.

12. The non-transitory computer-readable storage medium of claim 11 wherein the at least two line segments between the initial line segment and the final line segment are at least two internal edges and wherein the generating an output notch comprises:

extending each of the adjacent edges of the notch;

if an extension of only one of the adjacent edges collides with an internal edge at an intersection point, reporting a boundary of the output notch as including all vertices between the adjacent edge that intersects the internal edge and the intersection point; and if an extension of each of the adjacent edges collides with an internal edge or does not collide with any internal edge, reporting the boundary of the output notch as including all internal vertices.

13. The non-transitory computer-readable storage medium of claim 11 wherein the instructions comprise an instruction that, when executed by the processor, causes the processor to perform a step of:

excluding the output notch from correction data based on a filtering process using at least one of a height, a depth or a width of the notch.

14. The non-transitory computer-readable storage medium of claim 10 wherein the applying a plurality of conditions comprises:

applying a first condition that is satisfied when the direction of each of the adjacent edges is a same direction and the adjacent edges are parallel within a defined tolerance.

15. The non-transitory computer-readable storage medium of claim 10 wherein the at least one line segment between the initial line segment and the final line segment is a plurality of internal edges, the instructions comprising an instruction that, when executed by the processor, causes the processor to perform a step of:

defining a notch axis for the notch candidate as an axis orthogonal to each of the adjacent edges and pointed to one of an interior or an exterior of the polygon; and wherein applying the plurality of conditions comprises applying a first condition by:

forming a first set of edges having a same direction relative to the interior of the polygon as the notch axis and a second set of edges having a opposite direction relative to the interior of the polygon from the notch axis, such that the first set of edges includes at least one of the plurality of internal edges and the second set of edges includes at least one of the plurality of internal edges; and traversing the plurality of line segments along the direction of travel from the initial line segment to the final line segment; wherein the first condition is satisfied when the first set of edges is contiguous and the second set of edges is contiguous.

16. The non-transitory computer-readable storage medium of claim 10 wherein the instructions comprise an instruction that, when executed by the processor, causes the processor to perform a step of:

defining a notch axis for the notch candidate as an axis orthogonal to each of the adjacent edges and pointed to one of an interior or an exterior of the polygon; and wherein the applying a plurality of conditions comprises:

applying a first condition that is satisfied when the at least two line segments comprises at least one line segment having a same direction relative to the interior of the polygon as the notch axis and at least one line segment having an opposite direction relative to the interior of the polygon from the notch axis.

17. The non-transitory computer-readable storage medium of claim 16 wherein the notch axis is an average of the notch axis defined by each of the adjacent edges.

18. The non-transitory computer-readable storage medium of claim 10 wherein the at least two line segments between the initial line segment and the final line segment are a plurality of internal edges and wherein the applying a plurality of conditions comprises applying a first condition by:

defining an imaginary edge between an end point of the initial line segment as defined by the direction of travel and a starting point of the final line segment as defined by the direction of travel; and wherein the first condition is satisfied when a direction of the imaginary edge from the initial line segment and the final line segment is a same direction relative to the adjacent edges and does not intersect any edge of the plurality of internal edges.

19. The non-transitory computer-readable storage medium of claim 10 wherein the defined range is encompasses zero degrees.

20. A method, comprising:

defining, upon receipt of mask data, a notch candidate on a boundary of a polygon of the mask data, the notch candidate formed of a plurality of line segments, the plurality of line segments including an initial line segment, a final line segment and at least two line segments between the initial line segment and the final line segment, the initial line segment and the final line segment defining adjacent edges of the notch candidate and having an angle therebetween within a defined range;

defining a direction of each of the plurality of line segments as a direction of travel from the initial line segment to the final line segment; and applying, using a processor, a plurality of conditions to the plurality of line segments and the direction of travel, wherein the notch candidate is a notch when each of the plurality of conditions is satisfied.

* * * * *